United States Patent [19]
Hata

[11] Patent Number: 5,970,080
[45] Date of Patent: Oct. 19, 1999

[54] GALLIUM NITRIDE COMPOUND SEMICONDUCTOR LIGHT EMITTING ELEMENT AND METHOD FOR FABRICATING THE SAME

[75] Inventor: Toshio Hata, Nara, Japan

[73] Assignee: Sharp Kabushiki Kaisha, Osaka, Japan

[21] Appl. No.: 08/810,574

[22] Filed: Mar. 3, 1997

[30] Foreign Application Priority Data

Mar. 7, 1996 [JP] Japan .................................. 8-050275

[51] Int. Cl.$^6$ .................................................. H01S 3/19
[52] U.S. Cl. .............................. 372/45; 372/46; 257/22; 257/94; 257/103
[58] Field of Search .................. 372/45, 46; 257/12, 257/22, 94, 97, 103

[56] References Cited

U.S. PATENT DOCUMENTS

| | | | |
|---|---|---|---|
| 5,042,043 | 8/1991 | Hatano et al. | 372/45 |
| 5,185,755 | 2/1993 | Mori et al. | 372/46 |
| 5,247,533 | 9/1993 | Okazaki et al. | 372/45 |
| 5,272,109 | 12/1993 | Motoda | 372/45 |
| 5,386,429 | 1/1995 | Naito et al. | 372/45 |
| 5,420,066 | 5/1995 | Shima et al. | 437/129 |
| 5,583,880 | 12/1996 | Shakuda | 372/46 |
| 5,740,192 | 4/1998 | Hatano et al. | 372/45 |
| 5,751,752 | 5/1998 | Shakuda | 372/45 |
| 5,780,873 | 7/1998 | Itaya et al. | 257/521 |

FOREIGN PATENT DOCUMENTS

| | | | |
|---|---|---|---|
| 0 579 244 A2 | 1/1994 | European Pat. Off. | H01S 3/19 |
| 09046291 | 2/1996 | Japan | H01S 3/18 |

OTHER PUBLICATIONS

Pearton et al., Appl. Phys. Lett., 67, 16 (1995) (Oct.).
S. Pearton et al., *J. Vac. Sci. Technol.*, 11(4):1772–1775 (1993). (Jul./Aug.).

Primary Examiner—Rodney Bovernick
Assistant Examiner—Yisun Song
Attorney, Agent, or Firm—David G. Conlin; Dike, Bronstein, Roberts and Cushman, LLP

[57] ABSTRACT

The gallium nitride compound semiconductor light emitting element includes: a substrate; a first semiconductor multilayer structure including, at least, an active layer, a first cladding layer of a first conductivity type, and a second cladding layer of a second conductivity type, the first and second cladding layers sandwiching the active layer therebetween; a dry etching stop layer of the second conductivity type formed on the first semiconductor multilayer structure; and a second semiconductor multilayer structure formed on the dry etching stop layer.

21 Claims, 6 Drawing Sheets

GALLIUM NITRIDE COMPOUND SEMICONDUCTOR LIGHT EMITTING ELEMENT AND METHOD FOR FABRICATING THE SAME

BACKGROUND OF THE INVENTION

1. Field of the Invention

The present invention relates to a gallium nitride (GaN) compound semiconductor light emitting element capable of emitting light in the range of the blue region to the ultraviolet region.

2. Description of the Related Art

When a current blocking type or ridge waveguide type compound semiconductor laser is fabricated, a process of etching compound semiconductor layers of the laser to respective specified thicknesses with high precision or a process of selectively etching a layer to expose the surface of an underlying layer is required.

In the etching of a GaAs compound semiconductor layer, wet etching with high selectivity is normally employed. In the etching of a GaN compound semiconductor, dry etching is normally employed since no appropriate etchant is available. By dry etching, however, etching of a GaN compound semiconductor layer with sufficient selectivity is difficult. A GaN compound semiconductor which cannot be etched with sufficient selectivity will not be usable as a dry etching stop layer. Therefore, it is difficult to fabricate a current blocking type or ridge waveguide type semiconductor layer by dry etching with good reproducibility.

J. Vac. Sci. Technol., A 11 (4) 1993 pp. 1772–1775 describes the etching of GaN, InN, and AlN by ECR-RIBE (electron cyclotron resonance type reactive ion beam etching) which is one of the dry etching methods. This article discusses that the etching rate in this method has selectivity.

SUMMARY OF THE INVENTION

The gallium nitride compound semiconductor light emitting element of this invention includes a dry etching stop layer formed on a cladding layer located on an active layer, the dry etching stop layer having the same conductivity type as the cladding layer.

In one embodiment of the invention, the dry etching stop layer is an InN layer.

In another embodiment of the invention, the thickness of the InN dry etching stop layer is in the range of about 10 Å to about 50 Å.

Alternatively, in still another embodiment of the invention, the gallium nitride compound semiconductor light emitting element of this invention includes: a substrate; a first semiconductor multilayer structure formed on the substrate, including, at least, an active layer, a first cladding layer of a first conductivity type, and a second cladding layer of a second conductivity type, the first and second cladding layers sandwiching the active layer therebetween; a dry etching stop layer of the second conductivity type formed on the first semiconductor multilayer structure; and a second semiconductor multilayer structure formed on the dry etching stop layer.

In yet another embodiment of the invention, the substrate is of the first conductivity type.

In another embodiment of the invention, the substrate is non-conductive.

In still another embodiment of the invention, the second semiconductor multilayer structure includes: a current blocking layer of the first conductivity type having a stripe-shaped groove; a third cladding layer of the second conductivity type covering the top surface of the current blocking layer and the stripe-shaped groove; and a contact layer of the second conductivity type formed on the third cladding layer.

In another embodiment of the invention, the second semiconductor multilayer structure includes: a third cladding layer of the second conductivity type; and a contact layer of the second conductivity type, and the second semiconductor multilayer structure is a stripe-shaped ridge.

In still another embodiment of the invention, the first cladding layer and the second cladding layer are $Al_xGa_{1-x}N$ ($0 \leq x < 1$) layers, the active layer is an $In_yGa_{1-y}N$ ($0 \leq y \leq 1$: $y \neq 0$ when $x=0$) layer, and the dry etching stop layer is an InN layer.

In still yet another embodiment of the invention, the substrate is of the first conductivity type, and the first semiconductor multilayer structure includes: a buffer layer of the first conductivity type formed on the substrate; the first cladding layer formed on the buffer layer; the active layer formed on the first cladding layer; and the second cladding layer formed on the active layer.

According to another embodiment of the invention, the substrate is non-conductive, and the first semiconductor multilayer structure includes: a non-conductive first buffer layer formed on the substrate; a second buffer layer of the first conductivity type formed on the first buffer layer; the first cladding layer formed on the second buffer layer; the active layer formed on the first cladding layer; and the second cladding layer of the second conductivity type formed on the active layer.

According to still another aspect of the invention, a method for fabricating a gallium nitride compound semiconductor light emitting element is provided. The method includes the steps of: forming a first semiconductor multilayer structure on a substrate, the first semiconductor multilayer structure including, at least, an active layer, a first cladding layer of a first conductivity type, and a second cladding layer of a second conductivity type, the first and second cladding layers sandwiching the active layer therebetween; forming a dry etching stop layer of the second conductivity type on the first semiconductor multilayer structure; and forming a second semiconductor multilayer structure on the dry etching stop layer by use of etching.

According to another embodiment of the invention, the substrate is of the first conductivity type.

In another embodiment of the invention, the substrate is non-conductive.

In still another embodiment of the invention, the step of forming a second semiconductor multilayer structure includes the steps of: forming a current blocking layer on the dry etching stop layer; etching the current blocking layer down to the dry etching stop layer to form a stripe-shaped groove; forming a third cladding layer of the second conductivity type to cover the top surface of the current blocking layer and the stripe-shaped groove; and forming a contact layer of the second conductivity type on the third cladding layer.

In yet another embodiment of the invention, the step of forming a second semiconductor multilayer structure includes the steps of: forming a third cladding layer of the second conductivity type on the dry etching stop layer; forming a contact layer of the second conductivity type on the third cladding layer; and etching the third cladding layer and the contact layer down to the dry etching stop layer to form a ridge.

In another embodiment of the invention, the first cladding layer and the second cladding layer are $Al_xGa_{1-x}N$ ($0 \leq x < 1$) layers, the active layer is an $In_yGa_{1-y}N$ ($0 \leq y \leq 1$: $y \neq 0$ when $x=0$) layer, and the dry etching stop layer is an InN layer.

In yet another embodiment of the invention, the substrate is of the first conductivity type, and the step of forming a first semiconductor multilayer structure includes the steps of: forming a buffer layer of the first conductivity type on the substrate; forming the first cladding layer of the first conductivity type on the buffer layer; forming the active layer on the first cladding layer; and forming the second cladding layer of the second conductivity type on the active layer.

According to another embodiment of the invention, the buffer layer is formed of GaN, the first cladding layer is formed of $Al_xGa_{1-x}N$ ($0 \leq x < 1$), the active layer is formed of $In_yGa_{1-y}N$ ($0 \leq y \leq 1$: $y \neq 0$ when $x=0$), and the second cladding layer is formed of $Al_xGa_{1-x}N$ ($0 \leq x < 1$).

In still another embodiment of the invention, the substrate is non-conductive, and the step of forming a first semiconductor multilayer structure includes the steps of: forming a non-conductive first buffer layer on the substrate; forming a second buffer layer of the first conductivity type on the first buffer layer; forming the first cladding layer of the first conductivity type on the second buffer layer; forming the active layer on the first cladding layer; and forming the second cladding layer of the second conductivity type on the active layer.

In still another embodiment of the invention, the first buffer layer is formed of a material selected from the group consisting of AlN, GaN, and $Al_wGa_{1-w}N$ ($0 < w < 1$), the second buffer layer is formed of GaN, the first cladding layer is formed of $Al_xGa_{1-x}N$ ($0 \leq x < 1$), the active layer is formed of $In_yGa_{1-y}N$ ($0 \leq y \leq 1$: $y \neq 0$ when $x=0$), and the second cladding layer is formed of $Al_xGa_{1-x}N$ ($0 \leq x < 1$).

Thus, according to the present invention, selective etching of a gallium nitride compound semiconductor is possible by selecting appropriate etching conditions in the ECR-RIBE dry etching technique.

According to the present invention, an InN layer is formed on a cladding layer as a dry etching stop layer. The InN layer is extremely thinned and etched by ECR-RIBE. Thus, a current blocking type or ridge waveguide type semiconductor laser is realized.

The thickness of the InN dry etching stop layer is preferably in the range of about 10 Å to about 50 Å. When it exceeds about 50 Å, the absorption of laser light by the InN dry etching stop layer suddenly increases, lowering the efficiency of laser output. When it is less than about 10 Å, not only the thickness control at the formation of the layer is difficult, but also such a thin layer no more sufficiently serves as the etching stop layer.

More specifically, a current blocking type gallium nitride compound semiconductor laser or light emitting element can be realized by interposing an InN dry etching stop layer between an AlGaN second cladding layer and a GaN current blocking layer or an AlGaN upper cladding layer. Also, a ridge waveguide type gallium nitride compound semiconductor laser or light emitting element can be realized by interposing an InN dry etching stop layer between an AlGaN second cladding layer and an AlGaN upper cladding layer.

Thus, the invention described herein makes possible the advantages of: (1) providing a current blocking type or ridge waveguide type gallium nitride compound semiconductor light emitting element with good efficiency, and (2) providing a method for fabricating such a light emitting element using an etching method providing good reproducibility.

These and other advantages of the present invention will become apparent to those skilled in the art upon reading and understanding the following detailed description with reference to the accompanying figures.

DESCRIPTION OF THE PREFERRED EMBODIMENTS

The gallium nitride compound semiconductor laser according to the present invention includes a dry etching stop layer formed on a semiconductor multilayer structure. Another semiconductor multilayer structure is formed on the dry etching stop layer.

Figure 1:
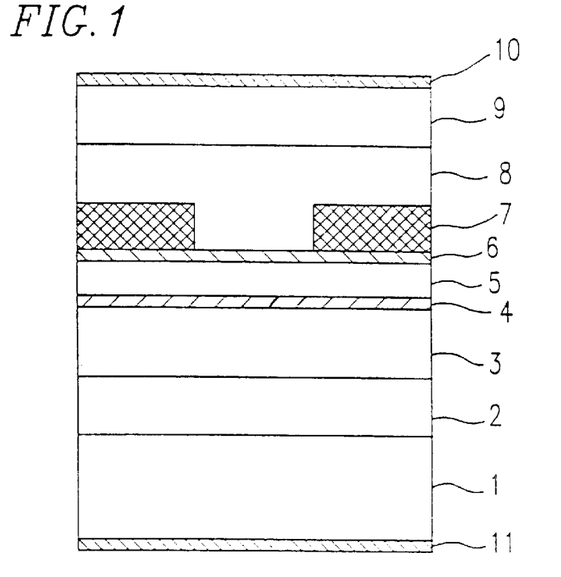
FIG. 1 is a schematic sectional view of a current blocking type gallium nitride compound semiconductor laser of Example 1 according to the present invention.
Figure 3:
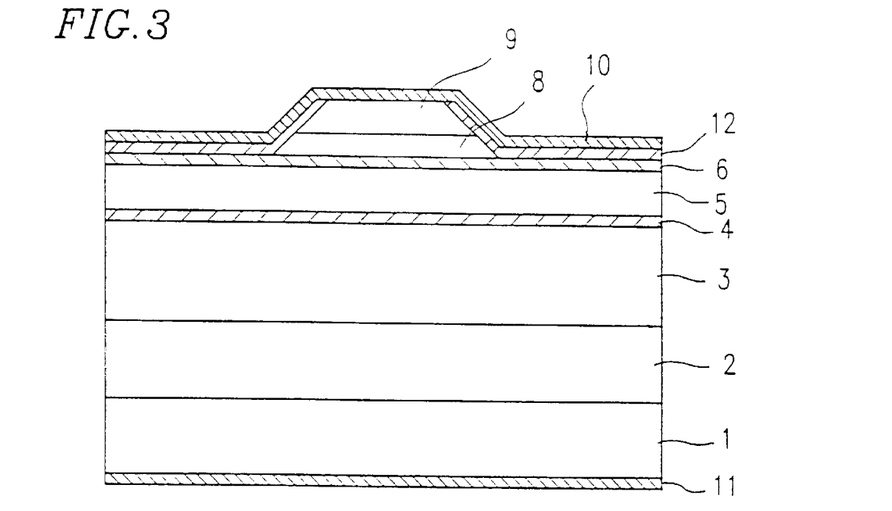
FIG. 3 is a schematic sectional view of a ridge waveguide type gallium nitride compound semiconductor laser of Example 3 according to the present invention.

The inventors of the present invention fabricated by way of trial gallium nitride compound semiconductor lasers of the current blocking type as shown in FIG. 1 and the ridge waveguide type as shown in FIG. 3 by selectively etching a GaN layer formed on an InN or AlN layer which was expected to serve as the dry etching stop layer by ECR-RIBE. As a result, the InN or AlN layer served as the dry etching stop layer, and the structures shown in FIGS. 1 and 3 were fabricated.

The resultant semiconductor structure using the AlN layer as the dry etching stop layer, however, failed to effect laser oscillation to operate as a laser. This is because AlN is not conductive and thus prevents current from flowing into an active layer of the semiconductor structure.

The semiconductor structure using the InN layer as the dry etching stop layer effects laser oscillation since InN is conductive. However, the efficiency of the laser becomes low. This is because, since the band gap of the InN layer is narrower than that of a light emitting layer of the structure, laser light emitted from the light emitting layer is absorbed by the InN dry etching stop layer.

The inventors have found that this problem can be overcome by setting the thickness of the InN dry etching stop layer in the range of about 10 Å to about 50 Å. Thus, a gallium nitride compound semiconductor laser with high efficiency can be obtained.

The thickness of the InN dry etching stop layer is preferably in the range of about 10 Å to about 50 Å, as described above. When it exceeds about 50 Å, the absorption of laser light by the InN dry etching stop layer suddenly increases, lowering the efficiency of laser output. When it is less than about 10 Å, not only does thickness control at the formation of the layer become difficult, but also such a thin layer does not sufficiently serve as an etching stop layer at the etching.

The present invention will now be described by way of examples with reference to the accompanying drawings. In the following examples, the thickness of the InN dry etching stop layer was set at about 30 Å. Any thickness can also be used as far as it is within the range of about 10 Å to about 50 Å.

EXAMPLE 1

FIG. 1 is a schematic sectional view of a gallium nitride compound semiconductor laser of Example 1 according to the present invention. The gallium nitride compound semiconductor laser of this example has a current blocking structure.

Referring to FIG. 1, the semiconductor laser of this example includes a low-resistance n-type 6H-SiC (0001) substrate 1 and semiconductor multilayer structures formed thereon.

A first semiconductor multilayer structure includes an n-type GaN buffer layer 2, an n-type $Al_{0.1}Ga_{0.9}N$ cladding layer 3, a non-doped $In_{0.32}Ga_{0.68}N$ active layer 4, and a p-type $Al_{0.1}Ga_{0.9}N$ cladding layer 5 formed in this order on the substrate 1. A p-type InN dry etching stop layer 6 is formed on the first semiconductor multilayer structure. A second semiconductor multilayer structure includes an p-type GaN current blocking layer 7, a p-type $Al_{0.1}Ga_{0.9}N$ cladding layer 8, and a p-type GaN contact layer 9 formed in this order on the p-type InN dry etching stop layer 6. A p-side electrode 10 and an n-side electrode 11 are formed on the top surface of the second semiconductor multilayer structure and the bottom surface of the substrate 1, respectively.

The gallium nitride compound semiconductor laser with the above structure is fabricated by metal organic chemical vapor deposition (MOCVD), for example, using ammonia ($NH_3$) as a V-group material, and trimethyl gallium (TMG), trimethyl aluminium (TMA), and trimethyl indium (TMI) as III-group materials. Bis(cyclopentadienyl)magnesium ($Cp_2Mg$) is used as a p-type dopant material, monosilane ($SiH_4$) is used as an n-type dopant material, and $H_2$ is used as a carrier gas.

The fabrication of the gallium nitride compound semiconductor laser is now described with reference to FIGS. 5A to 5E.

Figure 5A:
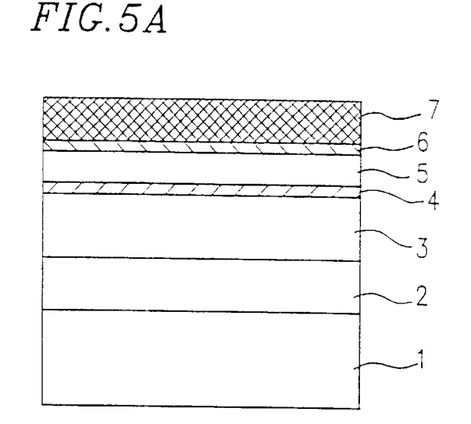
FIGS. 5A to 5E schematically illustrate steps of fabricating the current blocking type gallium nitride compound semiconductor laser of FIG. 1.

The low-resistance n-type 6H-SiC (0001) substrate 1 is placed on a susceptor in an MOCVD apparatus for the first crystal growth. The substrate is heated to about 1200° C. and exposed to an $NH_3$ atmosphere to clean the surface of the substrate. The temperature of the substrate 1 is then lowered to about 1000° C., and the n-type GaN buffer layer 2 is grown on the substrate 1 to a thickness in the range of about 0.5 μm to about 1 μm (e.g., 1 μm) by introducing a TMG gas at a flow rate in the range of 10 to 30 ccm (e.g., 20 ccm), an $NH_3$ gas at a flow rate in the range of 5 to 10 LM (e.g., 7 LM), and a $SiH_4$ gas at a flow rate in the range of 3 to 10 LM (e.g., 6 LM) for 10 to 20 minutes (e.g., 15 minutes). Then, the n-type $Al_{0.1}Ga_{0.9}N$ cladding layer 3 is grown on the n-type GaN buffer layer 2 to a thickness in the range of about 0.7 μm to about 1 μm (e.g., 1 μm) by introducing a TMG gas at a flow rate in the range of 10 to 30 ccm (e.g., 20 ccm), a TMA gas at a flow rate in the range of 3 to 8 ccm (e.g., 6 ccm), an $NH_3$ gas at a flow rate in the range of 5 to 10 LM (e.g., 7 LM), and a $SiH_4$ gas at a flow rate in the range of 3 to 10 LM (e.g., 6 LM) for 10 to 30 minutes (e.g., 20 minutes). The substrate temperature is then lowered to the range of about 800° C. to about 850° C. (e.g., 850° C.), and the non-doped $In_{0.32}Ga_{0.68}N$ active layer 4 is grown on the n-type cladding layer 3 to a thickness in the range of about 50 Å to about 800 Å (e.g., 50 Å) by introducing a TMI gas at a flow rate in the range of 30 to 70 ccm (e.g., 50 ccm), a TMG gas at a flow rate in the range of 3 to 8 ccm (e.g., 5 ccm), and an $NH_3$ gas at a flow rate in the range of 10 to 30 LM (e.g., 20 LM) for 5 to 60 seconds (e.g., 40 seconds). The substrate temperature is then raised to about 1000° C., and the Mg-doped $Al_{0.1}Ga_{0.9}N$ cladding layer 5 is grown on the active layer 4 to a thickness in the range of about 0.1 μm to about 0.3 μm (e.g., 0.3 μm) by introducing a TMG gas at a flow rate in the range of 10 to 30 ccm (e.g., 20 ccm), a TMA gas at a flow rate in the range of 3 to 8 ccm (e.g., 6 ccm), an $NH_3$ gas at a flow rate in the range of 5 to 10 LM (e.g., 7 LM), and a $Cp_2Mg$ gas at a flow rate in the range of 3 to 10 ccm (e.g., 6 ccm) for 3 to 10 minutes (e.g., 7 minutes). Then, after the substrate temperature is lowered to the range of about 800° C. to about 850° C. (e.g., 800° C.), the Mg-doped InN dry etching stop layer 6 is grown on the cladding layer 5 to a thickness of about 30 Å by introducing a TMI gas at a flow rate in the range of 30 to 70 ccm (e.g., 50 ccm), an $NH_3$ gas at a flow rate in the range of 10 to 30 LM (e.g., 20 LM), and a $Cp_2Mg$ gas at a flow rate in the range of 3 to 10 ccm (e.g., 6 ccm) for 7 to 100 seconds (e.g., 60 seconds). Then, after the substrate temperature is raised to about 1000° C., the n-type GaN current blocking layer 7 is grown on the dry etching stop layer 6 to a thickness in the range of about 0.1 μm to about 1 μm (e.g., about 0.5 μm) by introducing a TMG gas at a flow rate in the range of 10 to 30 ccm (e.g., 20 ccm), an $NH_3$ gas at a flow rate in the range of 5 to 10 LM (e.g., 7 LM), and a $SiH_4$ gas at a flow rate in the range of 3 to 10 LM (e.g., 6 LM) for 2 to 15 minutes (e.g., 7 minutes) (FIG. 5A).

Figure 5B:
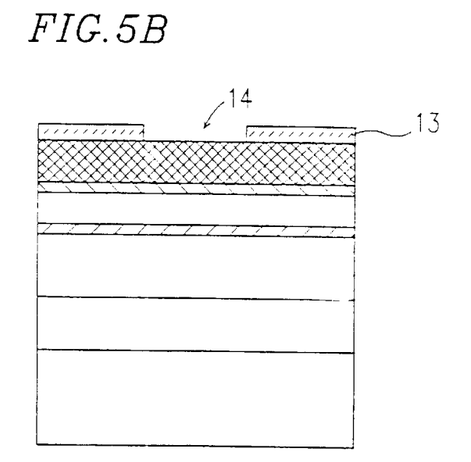

The resultant wafer is taken out from the MOCVD apparatus. A mask 13 made of $SiO_2$, $Si_3N_4$, or a photo-resist material is formed on the n-type GaN current blocking layer 7 and partially removed by normal photolithography to form a stripe-shaped groove 14 (FIG. 5B).

Figure 5C:
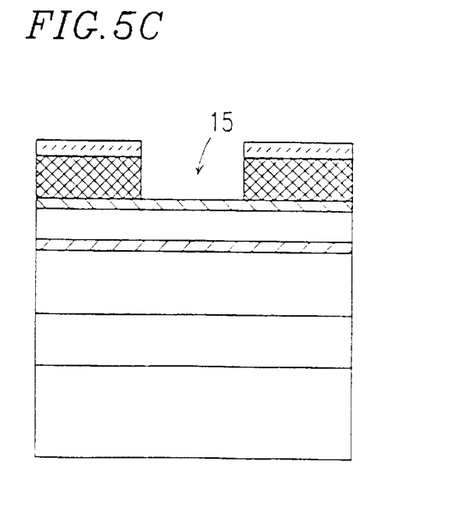

The resultant wafer is then placed in an ECR-RIBE apparatus, and the n-type GaN current blocking layer 7 is dry-etched under the conditions of the microwave power of 2.45 GHz, the microwave voltage of 200 W, the pressure of a reaction chamber of 1 m Torr, the self bias voltage of about −140 V, and the etching gas of $BCl_3$/Ar or $CCl_2F_2$/Ar until the surface of the Mg-doped InN dry etching stop layer 6 is exposed, forming a stripe-shaped groove 15 (FIG. 5C). Under the above conditions, the InN layer is not etched while the GaN layer is etched. The etching is thus automatically terminated at the surface of the Mg-doped InN dry etching stop layer 6. In this etching, the self bias voltage is preferably in the range of about −50 V to about −150 V. This is because the GaN layer starts to be etched at a voltage of about −50 V, while the InN layer at a voltage of about −150 V. Since the etching rate is larger as the absolute value of the self bias voltage is larger, the self bias voltage is set at about −140 V in this example. $SiCl_4$ may also be used as the etching gas.

Figure 5D:
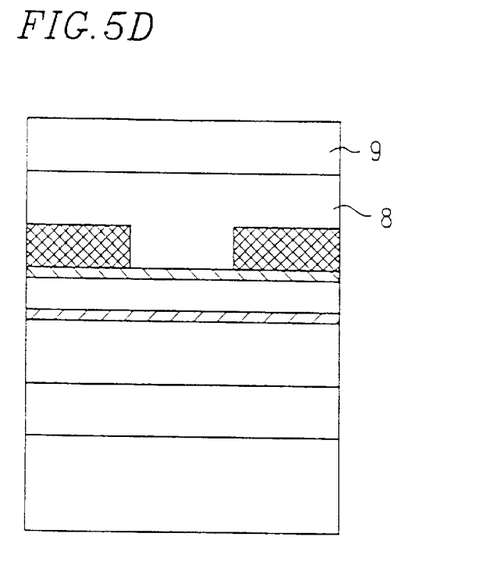

Subsequently, after the mask 13 is removed with a hydrofluoric acid etchant or an organic solvent, the wafer is placed again on the susceptor in the MOCVD apparatus for the second crystal growth. The substrate temperature is raised to about 1000° C., and the Mg-doped $Al_{0.1}Ga_{0.9}N$ cladding layer 8 is grown on the wafer to a thickness in the range of about 0.7 μm to about 1 μm (e.g., 1 μm) by introducing a TMG gas at a flow rate in the range of 10 to 30 ccm (e.g., 20 ccm), a TMA gas at a flow rate in the range of 3 to 8 ccm (e.g., 6 ccm), an $NH_3$ gas at a flow rate in the range of 5 to 10 LM (e.g., 7 LM), and a $Cp_2Mg$ gas at a flow rate in the range of 3 to 10 ccm (e.g., 6 ccm) for 15 to 25 minutes (e.g., 25 minutes). Then, the Mg-doped GaN contact layer 9 is grown on the cladding layer 8 to a thickness in the range of about 0.5 μm to about 1 μm (e.g., 0.5 μm) by introducing a TMG gas at a flow rate in the range of 30 to 60 ccm (e.g., 40 ccm), an $NH_3$ gas at a flow rate in the range of 1 to 6 LM (e.g., 4 LM), and a $Cp_2Mg$ gas at a flow rate in the range of 3 to 9 ccm (e.g., 6 ccm) for 7 to 15 minutes (e.g., 7 minutes) (FIG. 5D).

The resultant wafer is taken out from the MOCVD apparatus and subjected to annealing at about 700° C. under an $N_2$ atmosphere. The annealing is performed so as to thermally dissociate hydrogen from the Mg—H bond to remove hydrogen from the Mg-doped layers and thus allow the doped impurities to serve as acceptors, changing the Mg-doped layers to p-type layers.

Figure 5E:
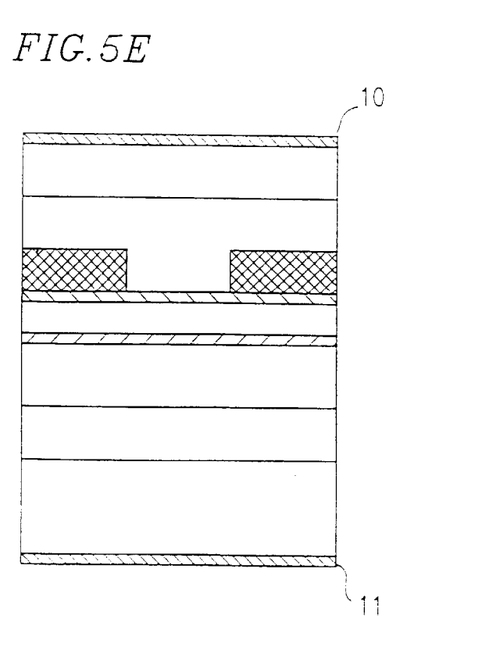

The p-side electrode 10 and the n-type electrode 11 are formed on the p-type GaN contact layer 9 and the bottom surface of the low-resistance n-type 6H-SiC (0001) substrate 1, respectively (FIG. 5E). Thus, the semiconductor laser of this example is completed.

EXAMPLE 2

Figure 2:
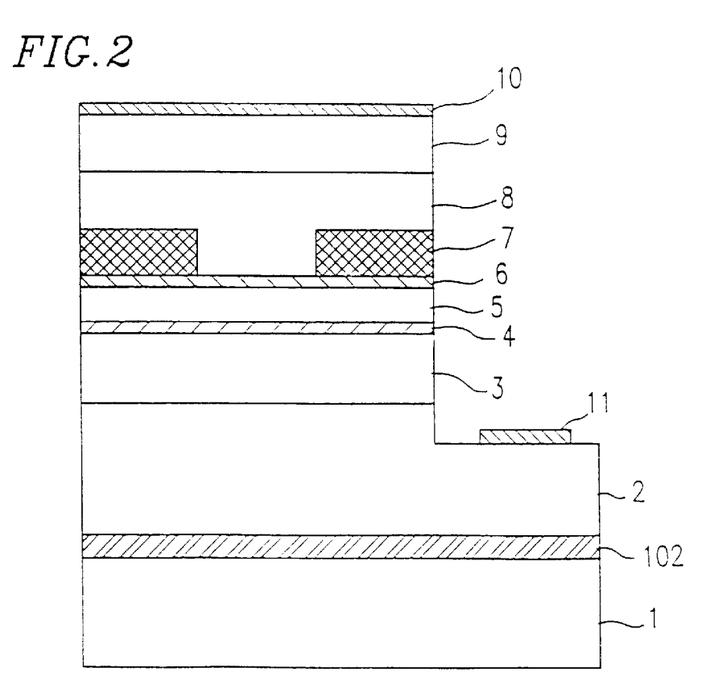
FIG. 2 is a schematic sectional view of a current blocking type gallium nitride compound semiconductor laser of Example 2 according to the present invention.

FIG. 2 is a schematic sectional view of a gallium nitride compound semiconductor laser of Example 2 according to the present invention. The gallium nitride compound semiconductor laser of this example has a current blocking structure.

Referring to FIG. 2, the semiconductor laser of this example includes an insulating sapphire (0001) substrate 1 and semiconductor multilayer structures formed thereon.

A first semiconductor multilayer structure includes a buffer layer 102 made of $Al_{0.1}Ga_{0.9}N$, an n-type GaN buffer layer 2, an n-type $Al_{0.1}Ga_{0.9}N$ cladding layer 3, a non-doped $In_{0.32}Ga_{0.68}N$ active layer 4, and a p-type $Al_{0.1}Ga_{0.9}N$ cladding layer 5 formed in this order on the substrate 1. A p-type InN dry etching stop layer 6 is formed on the first semiconductor multilayer structure. A second semiconductor multilayer structure includes an n-type GaN current blocking layer 7, a p-type $Al_{0.1}Ga_{0.9}N$ cladding layer 8, and a p-type GaN contact layer 9 formed in this order on the p-type InN dry etching stop layer 6. A p-side electrode 10 and an n-side electrode 11 are formed on the top surface of the second semiconductor multilayer structure and a portion of the top surface of the n-type GaN buffer layer 2, respectively.

The gallium nitride compound semiconductor laser with the above structure is fabricated by metal organic chemical vapor deposition (MOCVD), for example, using ammonia ($NH_3$) as a V-group material, and trimethyl gallium (TMG), trimethyl aluminium (TMA), and trimethyl indium (TMI) as III-group materials. Bis(cyclopentadienyl)magnesium ($Cp_2Mg$) is used as a p-type dopant, monosilane ($SiH_4$) is used as an n-type dopant, and $H_2$ is used as a carrier gas.

The fabrication of the gallium nitride compound semiconductor laser is now described with reference to FIGS. 6A to 6F.

Figure 6A:
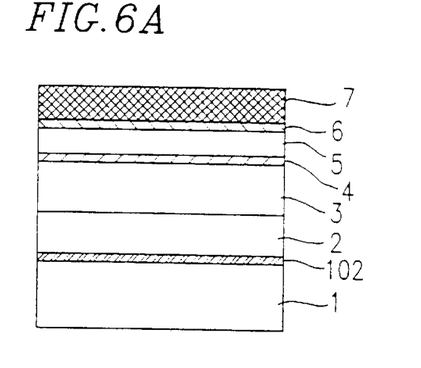
FIGS. 6A to 6F schematically illustrate steps of fabricating the current blocking type gallium nitride compound semiconductor laser of FIG. 2.

The sapphire (0001) substrate 1 is placed on a susceptor in an MOCVD apparatus for the first crystal growth. The substrate is heated to about 1200° C. and exposed to an $NH_3$ atmosphere to clean the surface of the substrate. After the temperature of the substrate 1 is lowered to the range of about 500° C. to about 650° C. (e.g., 550° C.), the buffer layer 102 made of $Al_{0.1}Ga_{0.9}N$ is grown on the substrate 1 to a thickness in the range of about 50 Å to about 2 μm (e.g., 550 Å) by introducing a TMG gas at a flow rate in the range of 10 to 30 ccm (e.g., 20 ccm), a TMA gas at a flow rate in the range of 3 to 8 ccm (e.g., 6 ccm), and an $NH_3$ gas at a flow rate in the range of 5 to 10 LM (e.g., 7 LM) for 5 seconds to 30 minutes (e.g., 1 minute). The buffer layer 102 may be made of GaN, AlN, or $Al_wGa_{1-w}N$ (0<w<1). Then, after the substrate temperature is raised to about 1000° C., the n-type GaN buffer layer 2 is grown on the buffer layer 102 to a thickness in the range of about 0.5 μm to about 1 μm (e.g., 0.7 μm) by introducing a TMG gas at a flow rate in the range of 10 to 30 ccm (e.g., 20 ccm), an $NH_3$ gas at a flow rate in the range of 5 to 10 LM (e.g., 7 LM), and an $SiH_4$ gas at a flow rate in the range of 3 to 10 LM (e.g., 6 LM) for 10 to 20 minutes (e.g., 11 minutes). Then, the n-type $Al_{0.1}Ga_{0.9}N$ cladding layer 3 is grown on the n-type GaN buffer layer 2 to a thickness in the range of about 0.7 μm to about 1 μm (e.g., 0.9 μm) by introducing a TMG gas at a flow rate in the range of 10 to 30 ccm (e.g., 20 ccm), a TMA gas at a flow rate in the range of 3 to 8 ccm (e.g., 6 ccm), an $NH_3$ gas at a flow rate in the range of 5 to 10 LM (e.g., 7 LM), and an $SiH_4$ gas at a flow rate in the range of 3 to 10 LM (e.g., 6 LM) for 10 to 30 minutes (e.g., 18 minutes). The substrate temperature is then lowered to the range of about 800° C. to about 850° C. (e.g., 800° C.), and the non-doped $In_{0.32}Ga_{0.68}N$ active layer 4 is grown on the n-type cladding layer 3 to a thickness in the range of about 50 Å to about 800 Å (e.g., 60 Å) by introducing a TMI gas at a flow rate in the range of 30 to 70 ccm (e.g., 50 ccm), a TMG gas at a flow rate in the range of 3 to 8 ccm (e.g., 5 ccm), and an $NH_3$ gas at a flow rate in the range of 10 to 30 LM (e.g., 20 LM) for 5 to 60 seconds (e.g., 50 seconds). The substrate temperature is then raised to about 1000° C., and the Mg-doped $Al_{0.1}Ga_{0.9}N$ cladding layer 5 is grown on the active layer 4 to a thickness in the range of about 0.1 μm to about 0.3 μm (e.g., 0.2 μm) by introducing a TMG gas at a flow rate in the range of 10 to 30 ccm (e.g., 20 ccm), a TMA gas at a flow rate in the range of 3 to 8 ccm (e.g., 6 ccm), an $NH_3$ gas at a flow rate in the range of 5 to 10 LM (e.g., 7 LM), and a $Cp_2Mg$ gas at a flow rate in the range of 3 to 10 ccm (e.g., 6 ccm) for 3 to 10 minutes (e.g., 5 minutes). Then, after the substrate temperature is lowered to the range of about 800° C. to about 850° C. (e.g., 810° C.), the Mg-doped InN dry etching stop layer 6 is grown on the p-type cladding layer 5 to a thickness of about 30 Å by introducing a TMI gas at a flow rate in the range of 30 to 70 ccm (e.g., 50 ccm), an $NH_3$ gas at a flow rate in the range of 10 to 30 LM (e.g., 20 LM), and a $Cp_2Mg$ gas at a flow rate in the range of 3 to 10 ccm (e.g., 6 ccm) for 7 to 100 seconds (e.g., 60 seconds). Then, after the substrate temperature is raised to about 1000° C., the n-type GaN current blocking layer 7 is grown on the dry etching stop layer 6 to a thickness in the range of about 0.1 μm to about 1 μm (e.g., about 0.5 μm) by introducing a TMG gas at a flow rate in the range of 10 to 30 ccm (e.g., 20 ccm), an $NH_3$ gas at a flow rate in the range of 5 to 10 LM (e.g., 7 LM), and an $SiH_4$ gas at a flow rate in the range of 3 to 10 LM (e.g., 6 LM) for 2 to 15 minutes (e.g., 7 minutes).

Figure 6B:
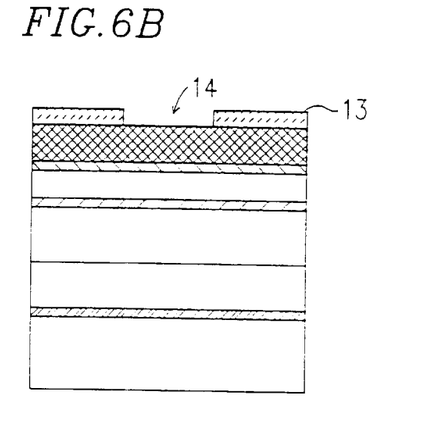

The resultant wafer is taken out from the MOCVD apparatus. A mask 13 made of $SiO_2$, $Si_3N_4$, or a photo-resist material is formed on the n-type GaN current blocking layer 7 and partially removed by normal photolithography to form a stripe-shaped groove 14 (FIG. 6B).

Figure 6C:
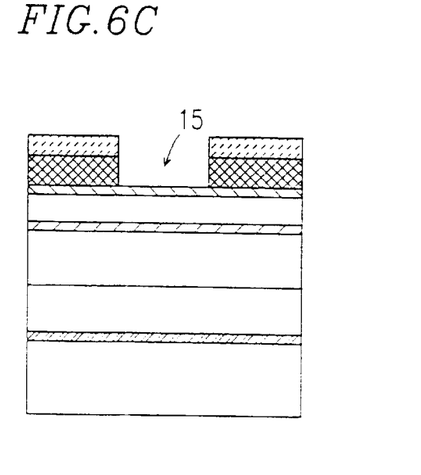

The resultant wafer is then placed in an ECR-RIBE apparatus, and the n-type GaN current blocking layer 7 is dry-etched under the conditions of the microwave power of 2.45 GHz, the microwave voltage of 200 W, the pressure of a reaction chamber of 1 m Torr, the self bias voltage of about −140 V, the etching gas of $BCl_3$/Ar or $CCl_2F_2$/Ar until the surface of the Mg-doped InN dry etching stop layer 6 is exposed, forming a stripe-shaped groove 15 (FIG. 6C). Under the above conditions, the InN layer is not etched while the GaN layer is etched. The etching is thus automatically terminated at the surface of the Mg-doped InN dry etching stop layer 6.

Figure 6D:
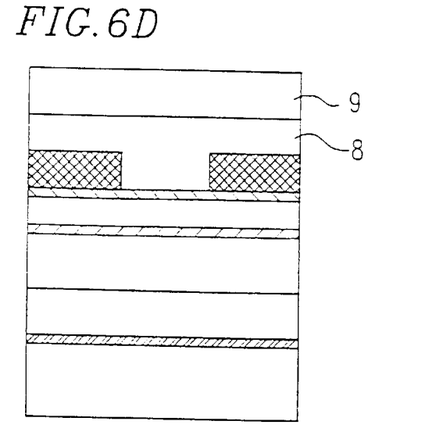

Subsequently, after the mask 13 is removed with a hydrofluoric acid etchant or an organic solvent, the wafer is placed again on the susceptor in the MOCVD apparatus for the second crystal growth. The substrate temperature is raised to about 1000° C., and the Mg-doped $Al_{0.1}Ga_{0.9}N$ cladding layer 8 is grown on the wafer to a thickness in the range of about 0.7 μm to about 1 μm (e.g., 0.7 μm) by introducing a TMG gas at a flow rate in the range of 10 to 30 ccm (e.g., 20 ccm), a TMA gas at a flow rate in the range of 3 to 8 ccm (e.g., 6 ccm), an $NH_3$ gas at a flow rate in the range of 5 to 10 LM (e.g., 7 LM), and a $Cp_2Mg$ gas at a flow rate in the range of 3 to 10 ccm (e.g., 6 ccm) for 15 to 25 minutes (e.g., 18 minutes). Then, the Mg-doped GaN contact layer 9 is grown on the cladding layer 8 to a thickness in the range of about 0.5 μm to about 1 μm (e.g., 0.5 μm) by introducing a TMG gas at a flow rate in the range of 30 to 60 ccm (e.g., 40 ccm), an $NH_3$ gas at a flow rate in the range of 1 to 6 LM (e.g., 4 LM), and a $Cp_2Mg$ gas at a flow rate in the range of 3 to 9 ccm (e.g., 6 ccm) for 7 to 15 minutes (e.g., 7 minutes) (FIG. 6D).

The resultant wafer is taken out from the MOCVD apparatus and subjected to annealing at about 700° C. under an $N_2$ atmosphere. The annealing is performed so as to thermally dissociate hydrogen from the Mg—H bond to remove hydrogen from the Mg-doped layers and thus allow the doped impurities to serve as acceptors, changing the Mg-doped layers to p-type layers.

Figure 6E:
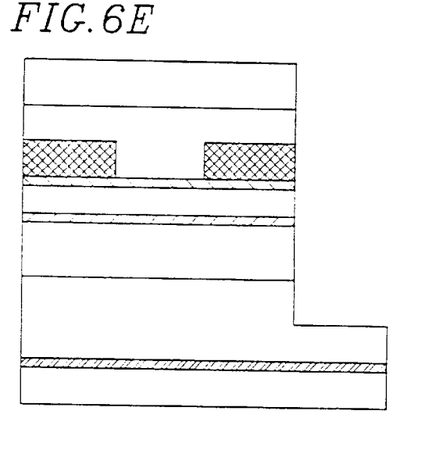

The resultant multilayer structure is then partially etched until the surface of the n-type GaN buffer layer 2 is exposed so that the n-side electrode 11 can be formed on the exposed surface (FIG. 6E).

Figure 6F:
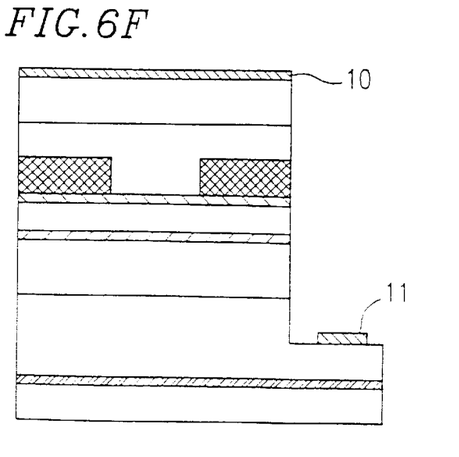

The p-side electrode 10 and the n-type electrode 11 are formed on the p-type GaN contact layer 9 and a portion of the surface of the n-type GaN buffer layer 2, respectively (FIG. 6F). Thus, the semiconductor laser of this example is completed.

EXAMPLE 3

FIG. 3 is a schematic sectional view of a gallium nitride compound semiconductor laser of Example 3 according to the present invention. The gallium nitride compound semiconductor laser of this example has a ridge waveguide structure.

Referring to FIG. 3, the semiconductor laser of this example includes a low-resistance 6H-SiC (0001) substrate 1 and semiconductor multilayer structures formed thereon.

A first semiconductor multilayer structure includes an n-type GaN buffer layer 2, an n-type $Al_{0.1}Ga_{0.9}N$ cladding layer 3, a non-doped $In_{0.32}Ga_{0.68}N$ active layer 4, and a p-type $Al_{0.1}Ga_{0.9}N$ cladding layer 5 formed in this order on the substrate 1. A p-type InN dry etching stop layer 6 is formed on the first semiconductor multilayer structure. A second semiconductor multilayer structure includes a p-type $Al_{0.1}Ga_{0.9}N$ cladding layer 8 and a p-type GaN contact layer 9 formed in this order on the p-type InN dry etching stop layer 6. An insulating film 12 is formed on the structure. A p-side electrode 10 and an n-side electrode 11 are formed on the top surface of the resultant structure and the bottom surface of the substrate 1, respectively.

The gallium nitride compound semiconductor laser with the above structure is fabricated by metal organic chemical vapor deposition (MOCVD), for example, using ammonia ($NH_3$) as a V-group material, and trimethyl gallium (TMG), trimethyl aluminium (TMA), and trimethyl indium (TMI) as III-group materials. Bis(cyclopentadienyl)magnesium ($Cp_2Mg$) is used as a p-type dopant, monosilane ($SiH_4$) is used as an n-type dopant, and $H_2$ is used as a carrier gas.

The fabrication of the gallium nitride compound semiconductor laser is now described with reference to FIGS. 7A to 7E.

Figure 7A:
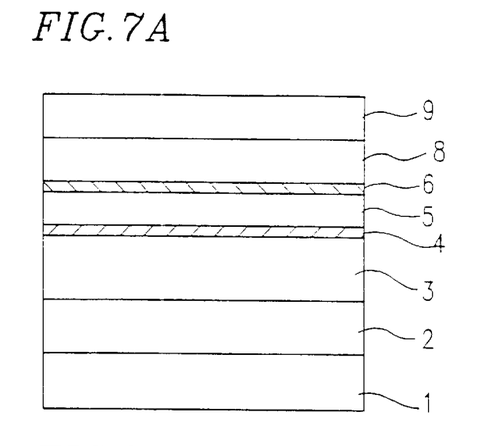
FIGS. 7A to 7E schematically illustrate steps of fabricating the ridge waveguide type gallium nitride compound semiconductor laser of FIG. 3.

The low-resistance n-type 6H-SiC (0001) substrate 1 is placed on a susceptor in an MOCVD apparatus for the first crystal growth. The substrate is heated to about 1200° C. and exposed to an $NH_3$ atmosphere to clean the surface of the substrate. After the substrate temperature is lowered to about 1000° C., the n-type GaN buffer layer 2 is grown on the substrate 1 to a thickness in the range of about 0.5 μm to about 1 μm (e.g., 0.8 μm) by introducing a TMG gas at a flow rate in the range of 10 to 30 ccm (e.g., 20 ccm), an $NH_3$ gas at a flow rate in the range of 5 to 10 LM (e.g., 7 LM), and an $SiH_4$ gas at a flow rate in the range of 3 to 10 LM (e.g., 6 LM) for 10 to 20 minutes (e.g., 12 minutes). Then, the n-type $Al_{0.1}Ga_{0.9}N$ cladding layer 3 is grown on the n-type GaN buffer layer 2 to a thickness in the range of about 0.7 μm to about 1 μm (e.g., 0.9 μm) by introducing a TMG gas at a flow rate in the range of 10 to 30 ccm (e.g., 20 ccm), a TMA gas at a flow rate in the range of 3 to 8 ccm (e.g., 6 ccm), an $NH_3$ gas at a flow rate in the range of 5 to 10 LM (e.g., 7 LM), and an $SiH_4$ gas at a flow rate in the range of 3 to 10 LM (e.g., 6 LM) for 10 to 30 minutes (e.g., 18 minutes). The substrate temperature is then lowered to the range of about 800° C. to about 850° C. (e.g., 820° C.), and the non-doped $In_{0.32}Ga_{0.68}N$ active layer 4 is grown on the n-type cladding layer 3 to a thickness in the range of about 50 Å to about 800 Å (e.g., 70 Å) by introducing a TMI gas at a flow rate in the range of 30 to 70 ccm (e.g., 50 ccm), a TMG gas at a flow rate in the range of 3 to 8 ccm (e.g., 5 ccm), and an $NH_3$ gas at a flow rate in the range of 10 to 30 LM (e.g., 20 LM) for 5 to 60 seconds (e.g., 60 seconds). The substrate temperature is then raised to about 1000° C., and the Mg-doped $Al_{0.1}Ga_{0.9}N$ cladding layer 5 is grown on the active layer 4 to a thickness in the range of about 0.2 μm to about 0.3 μm (e.g., 0.2 μm) by introducing a TMG gas at a flow rate in the range of 10 to 30 ccm (e.g., 20 ccm), a TMA gas at a flow rate in the range of 3 to 8 ccm (e.g., 6 ccm), an $NH_3$ gas at a flow rate in the range of 5 to 10 LM (e.g., 7 LM), and a $Cp_2Mg$ gas at a flow rate in the range of 3 to 10 cam (e.g., 6 ccm) for 3 to 10 minutes (e.g., 5 minutes). Then, after the substrate temperature is lowered to the range of about 800° C. to about 850° C. (e.g., 830° C.), the Mg-doped InN dry etching stop layer 6 is grown on the p-type cladding layer 5 to a thickness of about 30 Å by introducing a TMI gas at a flow rate in the range of 30 to 70 ccm (e.g., 50 ccm), an $NH_3$ gas at a flow rate in the range of 10 to 30 LM (e.g., 20 LM), and a $Cp_2Mg$ gas at a flow rate in the range of 3 to 10 ccm (e.g., 6 ccm) for 7 to 100 seconds (e.g., 60 seconds). Then, after the substrate temperature is raised to about 1000° C., the Mg-doped $Al_{0.1}Ga_9N$ cladding layer 8 is formed on the dry etching stop layer 6 to a thickness in the range of about 0.7 μm to about 0.9 μm (e.g., about 0.7 μm) by introducing a TMG gas at a flow rate in the range of 10 to 30 ccm (e.g., 20 ccm), a TMA gas at a flow rate in the range of 3 to 8 ccm (e.g., 6 ccm), an $NH_3$ gas at a flow rate in the range of 5 to 10 LM (e.g., 7 LM), and a $Cp_2Mg$ gas at a flow rate in the range of 3 to 10 ccm (e.g., 6 ccm) for 15 to 25 minutes (e.g., 18 minutes). Then, the Mg-doped GaN contact layer 9 is grown on the cladding layer 8 to a thickness in the range of about 0.1 $\mu$m to about 1 $\mu$m (e.g., 0.5 $\mu$m) by introducing a TMG gas at a flow rate in the range of 30 to 60 ccm (e.g., 40 ccm), an $NH_3$ gas at a flow rate in the range of 1 to 6 LM (e.g., 4 LM), and a $Cp_2Mg$ gas at a flow rate in the range of 3 to 9 ccm (e.g., 6 ccm) for 1 to 15 minutes (e.g., 7 minutes) (FIG. 7A).

Figure 7B:
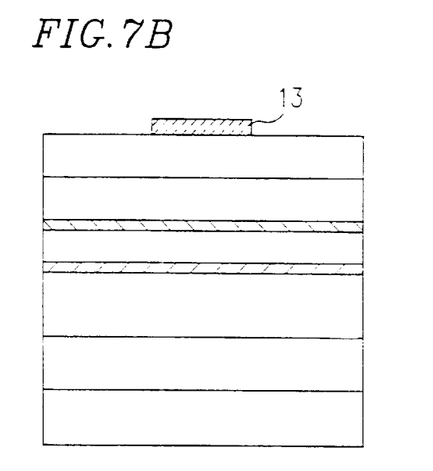

The resultant wafer is taken out from the MOCVD apparatus. A mask 13 made of $SiO_2$, $Si_3N_4$, or a photo-resist material is formed on the Mg-doped GaN contact layer 9 and partially removed by normal photolithography to form a stripe of the mask 13 (FIG. 7B).

Figure 7C:
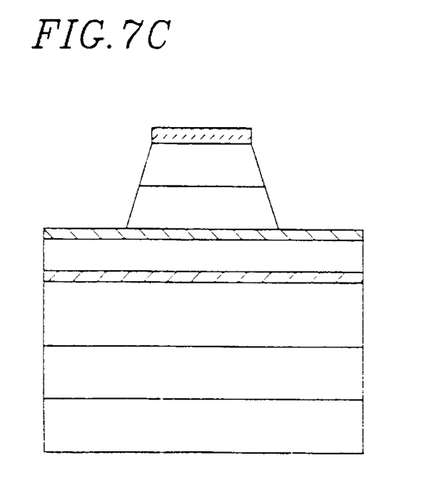
Figure 7D:
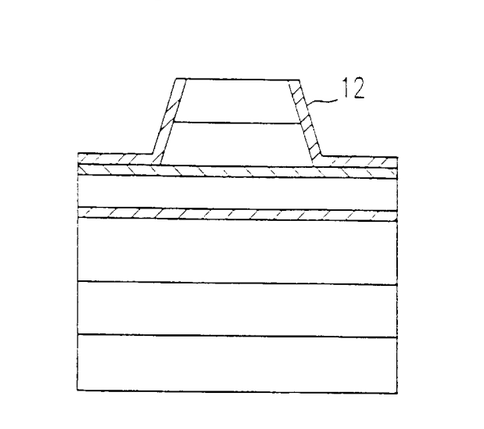

The resultant wafer is then placed in an ECR-RIBE apparatus, and the Mg-doped GaN contact layer 9 and the Mg-doped $Al_{0.1}Ga_{0.9}N$ cladding layer 8 are dry-etched under the conditions of the microwave power of 2.45 GHz, the microwave voltage of 200 W, the pressure of a reaction chamber of 1 m Torr, the self bias voltage of about –140 V, the etching gas of $BCl_3$/Ar or $CCl_2F_2$/Ar until the surface of the Mg-doped InN dry etching stop layer 6 is exposed (FIG. 7C). Under the above conditions, the InN layer is not etched while the GaN layer is etched. The etching is thus automatically terminated at the surface of the Mg-doped InN dry etching stop layer 6.

Subsequently, after the resist mask 13 is removed with a hydrofluoric acid etchant or an organic solvent, the wafer is subjected to annealing at about 700° C. under an $N_2$ atmosphere. The annealing is performed so as to thermally dissociate hydrogen from the Mg—H bond to remove hydrogen from the Mg-doped layers and thus allow the doped impurities to serve as acceptors, changing the Mg-doped layers to p-type layers. Thereafter the insulating film 12 made of $SiO_2$, $Si_3N_4$, or the like is formed by p-CVD.

Figure 7E:
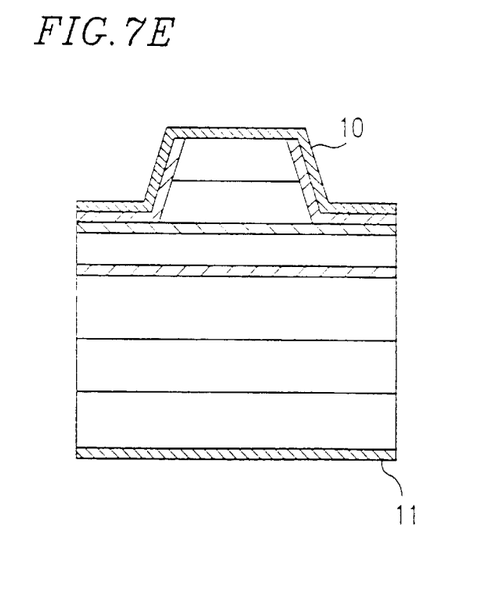

The p-side electrode 10 and the n-type electrode 11 are formed on the top surface of the resultant structure and the bottom surface of the low-resistance n-type 6H-SiC (0001) substrate 1, respectively (FIG. 7E). Thus, the semiconductor laser of this example is completed.

EXAMPLE 4

Figure 4:
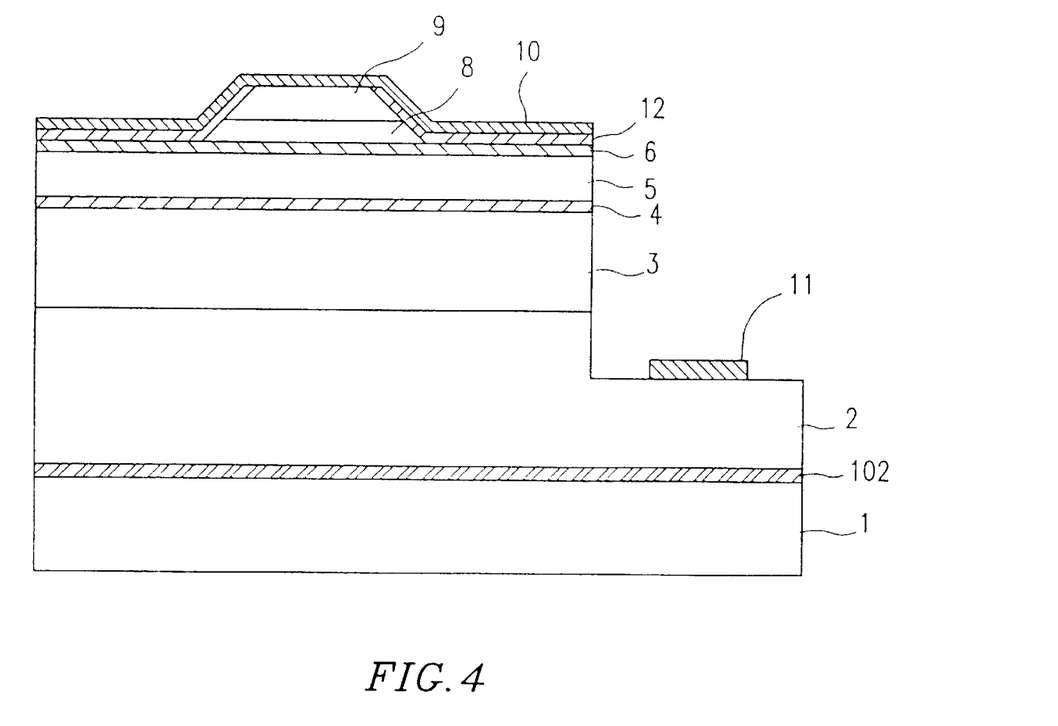
FIG. 4 is a schematic sectional view of a ridge waveguide type gallium nitride compound semiconductor laser of Example 4 according to the present invention.

FIG. 4 is a schematic sectional view of a gallium nitride compound semiconductor laser of Example 4 according to the present invention. The gallium-nitride compound semiconductor laser of this example has a ridge waveguide structure.

Referring to FIG. 4, the semiconductor laser of this example includes an insulating sapphire (0001) substrate 1 and semiconductor multilayer structures formed thereon.

A first semiconductor multilayer structure includes a buffer layer 102 made of GaN, AlN, or $Al_{0.1}Ga_{0.9}N$, an n-type GaN buffer layer 2, an n-type $Al_{0.1}Ga_{0.9}N$ cladding layer 3, a non-doped $In_{0.32}Ga_{0.68}N$ active layer 4, and a p-type $Al_{0.1}Ga_{0.9}N$ cladding layer 5 formed in this order on the substrate 1. A p-type InN dry etching stop layer 6 is formed on the first semiconductor multilayer structure. A second semiconductor multilayer structure includes a p-type $Al_{0.9}Ga_{0.9}N$ cladding layer 8 and a p-type GaN contact layer 9 formed in this order on the p-type InN dry etching stop layer 6. An insulating film 12 is formed on the structure. A p-side electrode 10 and an n-side electrode 11 are formed on the top surface of the resultant structure and a portion of a surface of the n-type GaN buffer layer 2, respectively.

The gallium nitride compound semiconductor laser with the above structure is fabricated by metal organic chemical vapor deposition (MOCVD), for example, using ammonia ($NH_3$) as a V-group material, and trimethyl gallium (TMG), trimethyl aluminium (TMA), and trimethyl indium (TMI) as III-group materials. Bis(cyclopentadienyl)magnesium ($Cp_2Mg$) is used as a p-type dopant, monosilane ($SiH_4$) is used as an n-type dopant, and $H_2$ is used as a carrier gas.

The fabrication of the gallium nitride compound semiconductor laser is now described with reference to FIGS. 8A to 8E.

The sapphire (0001) substrate 1 is placed on a susceptor in an MOCVD apparatus for the first crystal growth. The substrate is heated to about 1200° C. and exposed to an $NH_3$ atmosphere to clean the surface of the substrate. After the temperature of the substrate 1 is lowered to the range of about 500° C. to about 650° C. (e.g., 600°), the buffer layer 102 made of $Al_{0.1}Ga_{0.9}N$ is grown on the substrate 1 to a thickness in the range of about 500 Å to about 2 $\mu$m (e.g., 2 $\mu$m) by introducing a TMG gas at a flow rate in the range of 10 to 30 ccm (e.g., 20 ccm), a TMA gas at a flow rate in the range of 3 to 8 ccm (e.g., 6 ccm), and an $NH_3$ gas at a flow rate in the range of 5 to 10 LM (e.g., 7 LM) for 5 seconds to 30 minutes (e.g., 30 minutes). The buffer layer 102 may be made of GaN, AlN, or $Al_wGa_{1-w}N$ (0<w<1). Then, after the substrate temperature is raised to about 1000° C., the n-type GaN buffer layer 2 is grown on the buffer layer 102 to a thickness in the range of about 0.5 $\mu$m to about 4.0 $\mu$m (e.g., 4.0 $\mu$m) by introducing a TMG gas at a flow rate in the range of 10 to 30 ccm (e.g., 20 ccm), an $NH_3$ gas at a flow rate in the range of 5 to 10 LM (e.g., 7 LM), an $SiH_4$ gas at a flow rate in the range of 3 to 10 LM (e.g., 6 LM) for 10 to 60 minutes (e.g., 60 minutes). Then, the n-type $Al_{0.1}Ga_{0.9}N$ cladding layer 3 is grown on the n-type GaN buffer layer 2 to a thickness in the range of about 0.7 $\mu$m to about 1 $\mu$m (e.g., 0.7 $\mu$m) by introducing a TMG gas at a flow rate in the range of 10 to 30 ccm (e.g., 20 ccm), a TMA gas at a flow rate in the range of 3 to 8 ccm (e.g., 6 ccm), an $NH_3$ gas at a flow rate in the range of 5 to 10 LM (e.g., 7 LM), an $SiH_4$ gas at a flow rate in the range of 3 to 10 LM (e.g., 6 LM) for 10 to 30 minutes (e.g., 14 minutes). The substrate temperature is then lowered to the range of about 800° C. to about 850° C. (e.g., 850° C.), and the non-doped $In_{0.32}Ga_{0.68}N$ active layer 4 is grown on the n-type cladding layer 3 to a thickness in the range of about 50 Å to about 800 Å (e.g., 200 Å) by introducing a TMI gas at a flow rate in the range of 30 to 70 ccm (e.g., 50 ccm), a TMG gas at a flow rate in the range of 3 to 8 ccm (e.g., 5 ccm), and an $NH_3$ gas at a flow rate in the range of 10 to 30 LM (e.g., 20 LM) for 5 seconds to 11 minutes (e.g., 3 minutes). The substrate temperature is then raised to about 1000° C., and the Mg-doped $Al_{0.1}Ga_{0.9}N$ cladding layer 5 is grown on the active layer 4 to a thickness in the range of about 0.1 $\mu$m to about 0.3 $\mu$m (e.g., 0.3 $\mu$m) by introducing a TMG gas at a flow rate in the range of 10 to 30 ccm (e.g., 20 ccm), a TMA gas at a flow rate in the range of 3 to 8 ccm (e.g., 6 ccm), an $NH_3$ gas at a flow rate in the range of 5 to 10 LM (e.g., 7 LM), a $Cp_2Mg$ gas at a flow rate in the range of 3 to 10 ccm (e.g., 6 ccm) for 3 to 10 minutes (e.g., 8 minutes). Then, after the substrate temperature is lowered to the range of about 800° C. to about 850° C. (e.g., 800° C.), the Mg-doped InN dry etching stop layer 6 is grown on the p-type cladding layer 5 to a thickness of about 30 Å by introducing a TMI gas at a flow rate in the range of 30 to 70 ccm (e.g., 50 ccm), an $NH_3$ gas at a flow rate in the range of 10 to 30 LM (e.g., 20 LM), a $Cp_2Mg$ gas at a flow rate in the range of 3 to 10 ccm (e.g., 6 ccm) for 7 to 100 seconds (e.g., 60 seconds). Then, after the substrate temperature is raised to about 1000° C., the Mg-doped $Al_{0.1}Ga_{0.9}N$ cladding layer 8 is formed on the dry etching stop layer 6 to a thickness in the range of about 0.7 μm to about 0.9 μm (e.g., about 0.7 μm) by introducing a TMG gas at a flow rate in the range of 10 to 30 ccm (e.g., 20 ccm), a TMA gas at a flow rate in the range of 3 to 8 ccm (e.g., 6 ccm), an $NH_3$ gas at a flow rate in the range of 5 to 10 LM (e.g., 70 LM), a $Cp_2Mg$ gas at a flow rate in the range of 3 to 10 ccm (e.g., 6 ccm) for 17 to 22 minutes (e.g., 17 minutes). Then, the Mg-doped GaN contact layer 9 is grown on the cladding layer 8 to a thickness in the range of about 0.1 μm to about 1 μm (e.g., 0.5 μm) by introducing a TMG gas at a flow rate in the range of 30 to 60 ccm (e.g., 40 ccm), an $NH_3$ gas at a flow rate in the range of 1 to 6 LM (e.g., 4 LM), a $Cp_2Mg$ gas at a flow rate in the range of 3 to 9 ccm (e.g., 6 ccm) for 2 to 14 minutes (e.g., 7 minutes) (FIG. 8A).

The resultant wafer is taken out from the MOCVD apparatus. A mask 13 made of $SiO_2$, $Si_3N_4$, or a photo-resist material is formed on the Mg-doped GaN contact layer 9 and partially removed by normal photolithography to form a stripe of the mask 13 (FIG. 8B).

Figures 8A, 8B, 8C, 8D, 8E:
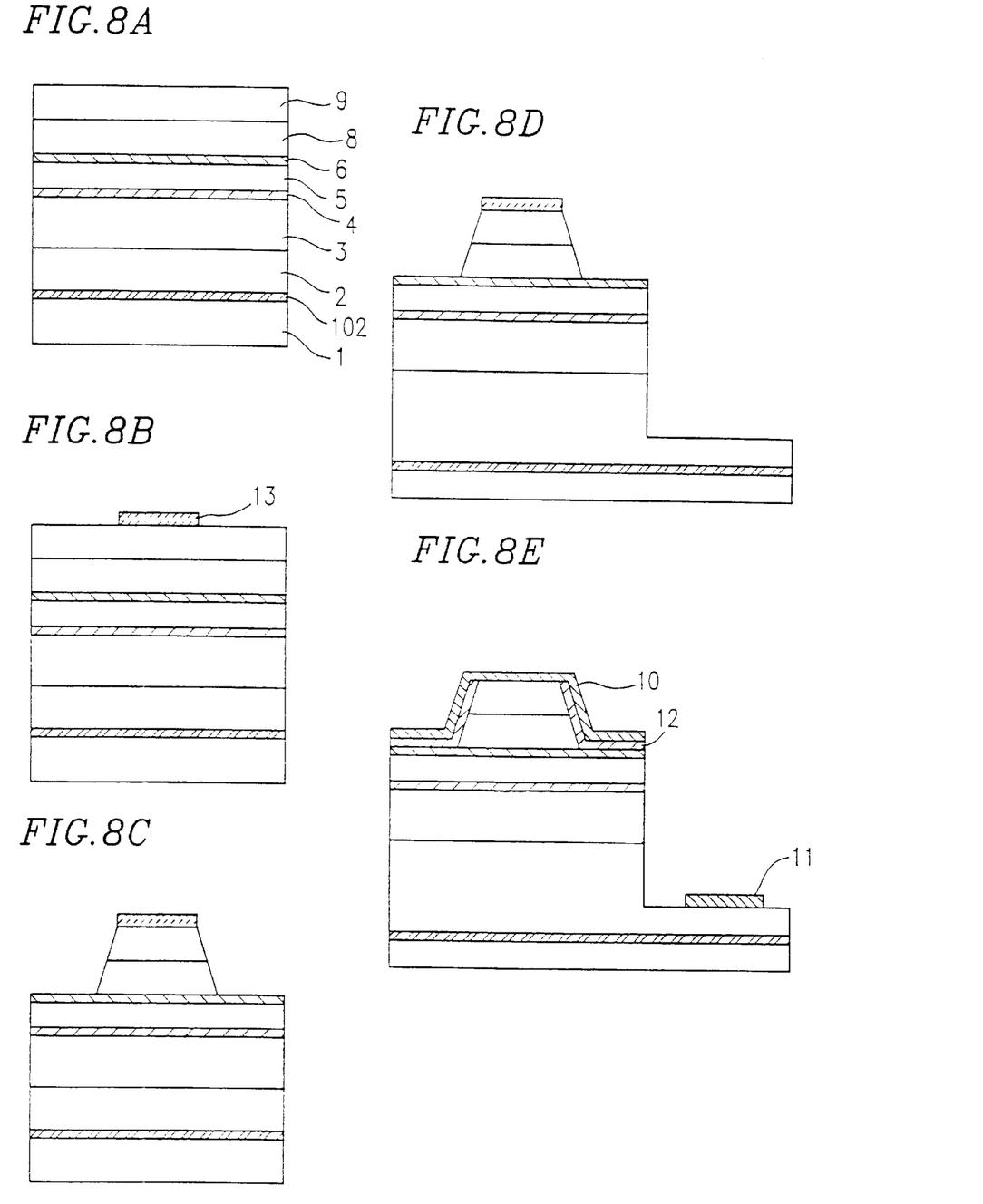
FIGS. 8A to 8E schematically illustrate steps of fabricating the ridge waveguide type gallium nitride compound semiconductor laser of FIG. 4.

The resultant wafer is then placed in an ECR-RIBE apparatus, and the Mg-doped GaN contact layer 9 and the Mg-doped $Al_{0.1}Ga_{0.9}N$ cladding layer 8 are dry-etched under the conditions of the microwave power of 2.45 GHz, the microwave voltage of 200 W, the pressure of a reaction chamber of 1 m Torr, the self bias voltage of about −140 V, the etching gas of $BCl_3/Ar$ or $CCl_2F_2/Ar$ until the surface of the Mg-doped InN dry etching stop layer 6 is exposed (FIG. 8C). Under the above conditions, the InN layer is not etched while the GaN layer is etched. The etching is thus automatically terminated at the surface of the Mg-doped InN dry etching stop layer 6.

The resultant multilayer structure is then partially etched until the surface of the n-type GaN buffer layer 2 is exposed (FIG. 8D). And the mask 13 is removed with a hydrofluoric acid etchant or an organic solvent. The wafer is then subjected to annealing at about 700° C. under an $N_2$ atmosphere. The annealing is performed so as to thermally dissociate hydrogen from the Mg—H bond to remove hydrogen from the Mg-doped layers and thus allow the doped impurities to serve as acceptors, changing the Mg-doped layers to p-type layers.

Thereafter, the insulating film 12 made of $SiO_2$, $Si_3N_4$, or the like is formed by P-CVD.

The p-side electrode 10 and the n-type electrode 11 are formed on the top surface of the resultant structure and a portion of the surface of the n-type GaN buffer layer 2, respectively (FIG. 8E). Thus, the semiconductor laser of this example is completed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gallium nitride compound semiconductor light emitting element, comprising:

a substrate;

a first semiconductor multilayer structure formed on the substrate, comprising, at least, an active layer, a first cladding layer of a first conductivity type, a second cladding layer of a second conductivity type, the first and second cladding layers sandwiching the active layer therebetween, and an inner current blocking layer;

an InN layer of the second conductivity type formed between the second cladding layer of the second conductivity type and the inner current blocking layer; and a second semiconductor multilayer structure formed on the InN layer.

2. A gallium nitride compound semiconductor light emitting element according to claim 1, wherein the thickness of the InN is in the range of about 10 Å to about 50 Å.

3. A gallium nitride compound semiconductor light emitting element according to claim 1, wherein the substrate is of the first conductivity type.

4. A gallium nitride compound semiconductor light emitting element according to claim 1, wherein the substrate is non-conductive.

5. A gallium nitride compound semiconductor light emitting element according to claim 1, wherein the substrate is of the first conductivity type, and the first semiconductor multilayer structure comprises:

a buffer layer of the first conductivity type formed on the substrate;

the first cladding layer formed on the buffer layer;

the active layer formed on the first cladding layer; and the second cladding layer formed on the active layer.

6. A gallium nitride compound semiconductor light emitting element according to claim 1, wherein the substrate is non-conductive, and the first semiconductor multilayer structure comprises:

a non-conductive first buffer layer formed on the substrate;

a second buffer layer of the first conductivity type formed on the first buffer layer;

the first cladding layer formed on the second buffer layer;

the active layer formed on the first cladding layer; and the second cladding layer of the second conductivity type formed on the active layer.

7. A gallium nitride compound semiconductor light emitting element according to claim 1, wherein the active layer is an $In_yGa_{1-y}N$ (0≦y<1: y≠0 when x=0) layer, the first cladding layer of the first conductivity type and the second cladding layer of the second conductivity type are $Al_xGa_{1-x}N$ (0≦x<1) layers, and the inner current blocking layer formed on the InN layer of the second conductivity type is a GaN layer of the first conductivity type.

8. A gallium nitride compound semiconductor light emitting element according to claim 1, wherein the second semiconductor multilayer structure formed on the InN layer comprises:

the GaN inner current blocking layer of the first conductivity type having a stripe-shaped groove;

an $Al_xGa_{1-x}N$ (0≦x<1) third cladding layer of the second conductivity type covering the top surface of the inner current blocking layer, the stripe-shaped groove, and the top surface of the InN layer in the stripe-shaped groove; and a GaN contact layer of the second conductivity type formed on the third cladding layer.

9. A method for fabricating a gallium nitride compound semiconductor light emitting element, comprising the steps of:

forming, at least, an active layer, a first cladding layer of a first conductivity type, a second cladding layer of a second conductivity type, and an inner current blocking layer on a substrate, the first and second cladding layer of a first conductivity type, a second cladding layer of a second conductivity type, and an inner current blocking layer on a substrate, the first and second cladding layers sandwiching the active layer therebetween; and forming an InN layer of the second conductivity type between the second cladding layer and the inner current blocking layer.

10. A method for fabricating a gallium nitride compound semiconductor light emitting element according to claim 9, wherein the substrate is of the first conductivity type.

11. A method for fabricating a gallium nitride compound semiconductor light emitting element according to claim 9, wherein the substrate is non-conductive.

12. A method for fabricating a gallium nitride compound semiconductor light emitting element according to claim 9, wherein the step of forming a second semiconductor multilayer structure comprises the steps of:

forming a GaN inner current blocking layer on the InN layer;

etching the GaN inner current blocking layer down to the InN layer to form a stripe-shaped groove;

forming a $Al_xGa_{1-x}N$ ($0 \leq x < 1$) third cladding layer of the second conductivity type to cover the top surface of the GaN current blocking layer, the stripe-shaped groove and the top surface of InN layer at the stripe-shaped groove; and forming a contact layer of the second conductivity type on the third cladding layer.

13. A method for fabricating a gallium nitride compound semiconductor light emitting element according to claim 9, wherein the active layer is an $In_yGa_{1-y}N$ ($0 \leq y \leq 1$: $y \neq 0$ when x=0) layer, the first cladding layer of the first conductivity type and the second cladding layer of the second conductivity type are $Al_xGa_{1-x}N$ ($0 \leq x < 1$) layers, and the inner current blocking layer formed on the InN layer of the second conductivity type is a GaN layer of the first conductivity type.

14. A gallium nitride compound semiconductor light emitting element, comprising:

a substrate; and a semiconductor multilayer structure formed on the substrate, comprising, at least, an active layer, a first cladding layer of a first conductivity type, a second cladding layer of a second conductivity type, the first and second cladding layers sandwiching the active layer therebetween, an InN layer of the second conductivity layer, a third cladding layer of the second conductivity type, and a contact layer, wherein the InN layer of the second conductivity type is formed between the second cladding layer of the second conductivity type and the third cladding layer of the second conductivity type.

15. A gallium nitride compound semiconductor light emitting element according to claim 14, wherein the active layer is an $In_yGa_{1-y}N$ ($0 \leq y \leq 1$: $y \neq 0$ when x=0) layer, the first cladding layer of the first conductivity type and the second cladding layer of the second conductivity type are $Al_xGa_{1-x}N$ ($0 \leq x < 1$) layers, and the third cladding layer formed on the InN layer of the second conductivity type and the contact layer are $Al_xGa_{1-x}N$ ($0 \leq x < 1$) layers.

16. A gallium nitride compound semiconductor light emitting element according to claim 14, wherein the semiconductor multilayer structure is of a stripe-shaped ridge where the $Al_xGa_{1-x}N$ second cladding layer of the second conductivity type, the InN layer of the second conductivity type, the $Al_xGa_{1-x}N$ third cladding layer of the second conductivity type, and the contact layer constitute a ridge portion, and the $Al_xGa_{1-x}N$ second cladding layer of the second conductivity type constitute side portions of the ridge portion.

17. A method for fabricating a gallium nitride compound semiconductor light emitting element, comprising:

forming, at least, an active layer, a first cladding layer of a first conductivity type, a second cladding layer of a second conductivity type, a third cladding layer of the second conductivity type, and a contact layer of the second conductivity type on a substrate, the first and second cladding layers sandwiching the active layer therebetween;

forming a InN layer of the second conductivity type between the second cladding layer and the third cladding layer.

18. A method for fabricating a gallium nitride compound semiconductor light emitting element according to claim 17, wherein the active layer is an $In_yGa_{1-y}N$ ($0 \leq y < 1$: $y \neq 0$ when x=0) layer, the first cladding layer of the first conductivity type and the second cladding layer of the second conductivity type are $Al_xGa_{1-x}N$ ($0 \leq x < 1$) layers, and the third cladding layer formed on the InN layer of the second conductivity type and the contact layer are $Al_xGa_{1-x}N$ ($0 \leq x < 1$) layers.

19. A method for fabricating a gallium nitride compound semiconductor light emitting element according to claim 17, further comprising:

etching the third cladding layer and the contact layer down to the InN layer to form a stripe-shaped ridge so as to the stripe-shaped ridge has a ridge portion nd a side portions of the ridge portion, wherein the ridge portion is constituted from the $Al_xGa_{1-x}N$ second cladding layer of the second conductivity type and the InN layer of the second conductivity type, the $Al_xGa_{1-x}N$ third cladding layer of the second conductivity type, and the contact layer; and the side portions of the ridge portion are constituted from the $Al_xGa_{1-x}N$ second cladding layer of the second conductivity type and the InN layer of the second conductivity type.

20. A method for fabricating a gallium nitride compound semiconductor light emitting element according to claim 17, wherein the substrate is of the first conductivity type.

21. A method for fabricating a gallium nitride compound semiconductor light emitting element according to claim 17, wherein the substrate is non-conductive.

* * * * *